United States Patent
Tanaka

(10) Patent No.: US 10,421,884 B2
(45) Date of Patent: Sep. 24, 2019

(54) METHOD OF CONTROLLING SELECTIVITY USING COMPOSITION FOR POLISHING SILICON NITRIDE

(71) Applicant: NITTA HAAS INCORPORATED, Osaka (JP)

(72) Inventor: Rika Tanaka, Kyoto (JP)

(73) Assignee: NITTA HAAS INCORPORATED, Osaka (JP)

( * ) Notice: Subject to any disclaimer, the term of this patent is extended or adjusted under 35 U.S.C. 154(b) by 0 days.

(21) Appl. No.: 15/396,325

(22) Filed: Dec. 30, 2016

(65) Prior Publication Data

US 2017/0158912 A1 Jun. 8, 2017

Related U.S. Application Data

(63) Continuation of application No. 13/124,948, filed as application No. PCT/JP2009/068027 on Oct. 19, 2009, now abandoned.

(30) Foreign Application Priority Data

Oct. 20, 2008 (JP) .................................. 2008-270396

(51) Int. Cl.
*H01L 21/302* (2006.01)
*C09G 1/02* (2006.01)
(Continued)

(52) U.S. Cl.
CPC .............. *C09G 1/02* (2013.01); *C09K 3/1409* (2013.01); *C23F 3/00* (2013.01); *H01L 21/31053* (2013.01); *H01L 21/3212* (2013.01)

(58) Field of Classification Search
CPC .. C09G 1/02; H01L 21/31053; H01L 21/3212
(Continued)

(56) References Cited

U.S. PATENT DOCUMENTS

| 5,391,258 A | 2/1995 | Brancaleoni et al. |
| 6,239,032 B1 * | 5/2001 | Nakamura ............... C09G 1/02 |
| | | 216/89 |

(Continued)

FOREIGN PATENT DOCUMENTS

| CN | 1379074 A | 11/2002 |
| EP | 1650278 A2 | 4/2006 |

(Continued)

OTHER PUBLICATIONS

Office Action in CN Application No. 200980141605.X, dated Feb. 6, 2017.
(Continued)

*Primary Examiner* — Binh X Tran
*Assistant Examiner* — Christopher Remavege
(74) *Attorney, Agent, or Firm* — Hauptman Ham, LLP

(57) ABSTRACT

A composition for polishing silicon nitride according to the present invention includes colloidal silica, a polishing aid including a phosphoric acid compound and a sulfuric acid compound. By further including an oxidizing agent, a first selectivity representing the ratio of a polishing speed for a metal layer to a polishing speed for a silicon nitride layer and a second selectivity representing the ratio of a polishing speed for an oxide insulating layer to a polishing speed for a silicon nitride are controlled.

2 Claims, 13 Drawing Sheets

(51) Int. Cl.
*H01L 21/3105* (2006.01)
*H01L 21/321* (2006.01)
*C09K 3/14* (2006.01)
*C23F 3/00* (2006.01)

(58) Field of Classification Search
USPC .... 438/689, 690, 691, 692, 693; 216/38, 52, 216/83, 89, 90, 95, 96, 99; 252/79.1, 252/79.2, 79.3, 79.4, 79.5
See application file for complete search history.

(56) References Cited

U.S. PATENT DOCUMENTS

| | | | |
|---|---|---|---|
| 6,350,690 B1* | 2/2002 | Schwartz | H01L 21/3212 257/E21.304 |
| 6,746,314 B2 | 6/2004 | Kim et al. | |
| 8,043,970 B2* | 10/2011 | Lee | C09G 1/02 438/691 |
| 8,221,642 B2 | 7/2012 | Li et al. | |
| 8,419,970 B2 | 4/2013 | Kamimura | |
| 8,901,001 B2* | 12/2014 | Chang | C09G 1/02 438/690 |
| 2002/0011031 A1 | 1/2002 | Hattori et al. | |
| 2003/0166338 A1* | 9/2003 | Ahn | C09G 1/02 438/689 |
| 2004/0147118 A1* | 7/2004 | Liu | C09G 1/02 438/689 |
| 2004/0203252 A1* | 10/2004 | Park | C09G 1/02 438/759 |
| 2005/0181609 A1 | 8/2005 | Kurata et al. | |
| 2006/0084270 A1 | 4/2006 | Hiramitsu et al. | |
| 2007/0298611 A1 | 12/2007 | Bian | |
| 2007/0298612 A1* | 12/2007 | Dysard | C09G 1/02 438/689 |
| 2008/0116170 A1 | 5/2008 | Collins et al. | |
| 2009/0325383 A1 | 12/2009 | Andou et al. | |
| 2010/0216315 A1 | 8/2010 | Yaguchi et al. | |

FOREIGN PATENT DOCUMENTS

| | | |
|---|---|---|
| GB | 2375116 A | 11/2002 |
| JP | 6-124932 A | 5/1994 |
| JP | 9-45660 A | 2/1997 |
| JP | 11-176773 A | 7/1999 |
| JP | 2000-109795 A | 4/2000 |
| JP | 2001-115146 A | 4/2001 |
| JP | 2001-323256 A | 11/2001 |
| JP | 2004-214667 A | 7/2004 |
| JP | 2006-120728 A | 5/2006 |
| JP | 2007-150264 A | 6/2007 |
| JP | 2007-208220 A | 8/2007 |
| JP | 2008-93819 A | 4/2008 |
| JP | 2008-101132 A | 5/2008 |
| JP | 2008-179763 A | 8/2008 |
| JP | 2008-227098 A | 9/2008 |
| WO | 2007/146065 A1 | 12/2007 |
| WO | 2008/114563 A1 | 9/2011 |

OTHER PUBLICATIONS

International Search Report in International Application No. PCT/JP2009/068027, dated Nov. 24, 2009.
Office Action in JP Application No. 2010-532764, dated Oct. 26, 2010.
Office Action in JP Application No. 2010-532764, dated Jan. 25, 2011.
International Preliminary Report on Patentability in International Application No. PCT/JP2009/068027, dated May 17, 2011.
Trial Decision in the appeal stage in JP application No. 2010-532764, dated Oct. 11, 2011.
Extended European Search Report in EP 09822011.4, dated Feb. 3, 2012.
Office Action in Singapore Application No. 201102739-8, dated Aug. 1, 2012.
Office Action in CN patent application No. 200980141605.X, dated May 16, 2013.
Office Action in CN patent application No. 200980141605.X, dated Sep. 25, 2012.
Office Action in JP patent application No. 2011-96386, dated Oct. 1, 2013.
Office Action in CN patent application No. 200980141605.X, dated Nov. 4, 2013.
Office Action in JP patent application No. 2011-096386, dated Feb. 25, 2014.
Office Action in TW patent application No. 098135342, dated Feb. 21, 2014.
Office Action in EP patent application No. 09822011.4, dated Mar. 20, 2014.
Office Action in CN patent application No. 200980141605.X, dated Apr. 25, 2014.
Decision for Refusal and Decision for Dismissal of Amendment in JP patent application No. 2011-096386, dated Jul. 1, 2014.
Office Action in TW patent application No. 098135342, dated Sep. 25, 2014.
Office Action in CN patent application No. 200980141605.X, dated Dec. 1, 2014.
Office Action in KR patent application No. 10-2011-7010294, dated Feb. 4, 2015.
Decision of Rejection CN Patent Application No. 200980141605.X, dated Aug. 13, 2015.
Trial Decision in JP Patent Application No. 2011-96386, dated Sep. 1, 2015.
Office Action in CN Application No. 200980141605.X, dated Apr. 5, 2016.
Office Action in EP Application No. 09822011.4, dated Jun. 27, 2016.
Office Action in CN Application No. 200980141605.X, dated Jul. 19, 2017, 13pp.
Office Action in CN Application No. 200980141605.X, dated Feb. 2, 2018, 12pp.
Toshiro Dohi, "Details of Semiconductor CMP Technology", 2000, 230-239, 284-287 and 362 pages, Yukio Shimura, Kogyo Chosakai Publishing Co., Ltd., Japan, 11pp.
"Semiconductor CMP Glossary", The Japan Society for Precision Engineering, the Planarization and CMP Technical Committee, Oct. 24, 2008, 94-97, 162-163 and 262 pages, Ohmsha, Ltd., Japan, 7pp.

* cited by examiner

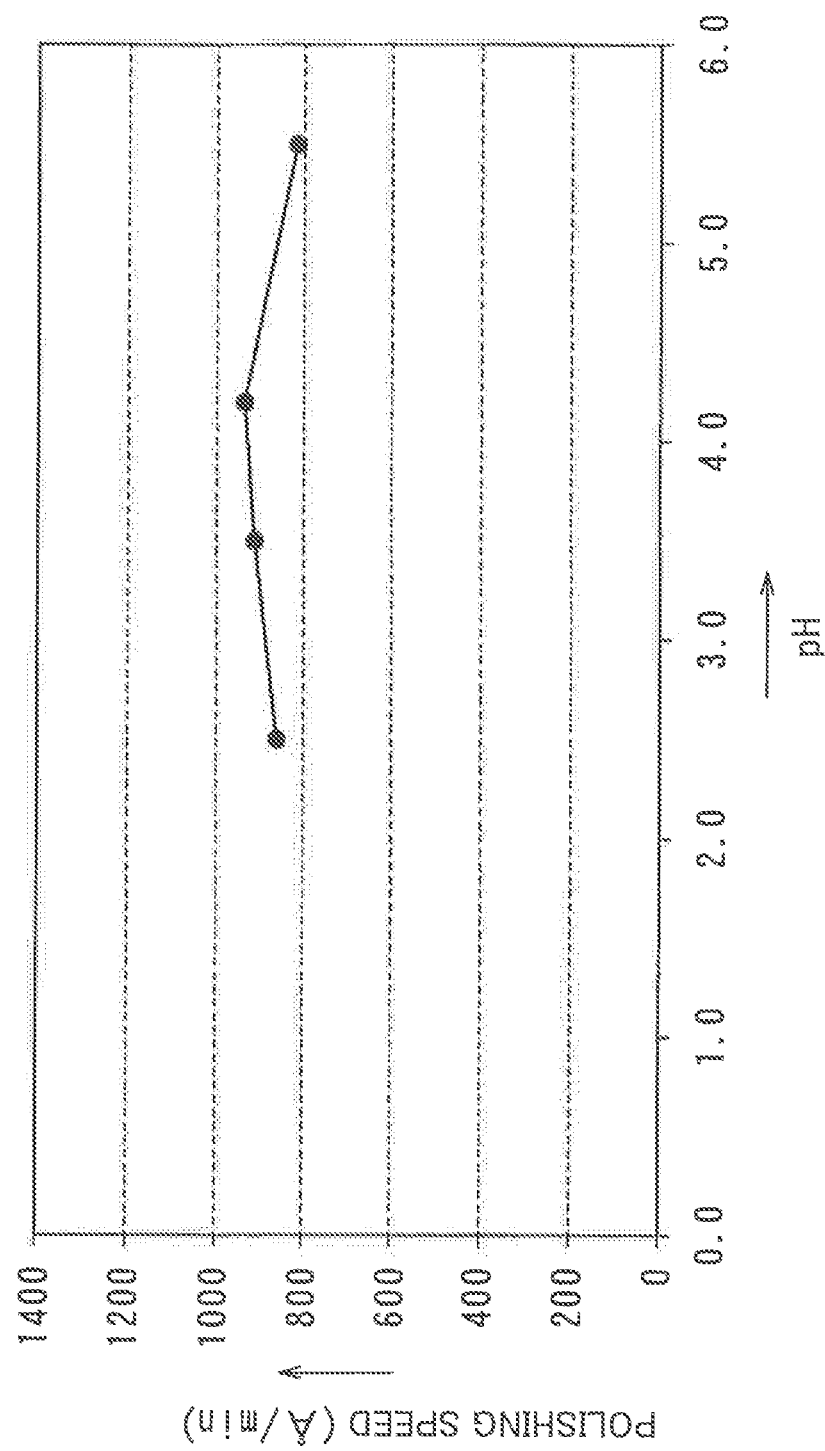

METHOD OF CONTROLLING SELECTIVITY USING COMPOSITION FOR POLISHING SILICON NITRIDE

RELATED APPLICATIONS

The present application is a continuation application of application Ser. No. 13/124,948, filed Apr. 19, 2011, which is a National Phase of International Application Number PCT/JP2009/068027, filed Oct. 19, 2009, and claims priority from Japanese Application Number 2008-270396, filed Oct. 20, 2008. The contents of all of the above-listed prior-filed applications are incorporated by reference herein in their entirety.

TECHNICAL FIELD

The present invention relates to CMP polishing process, and more specifically to a composition for polishing silicon nitride for use in polishing a silicon nitride layer and a method of controlling selectivity using the same.

BACKGROUND ART

CMP (Chemical Mechanical Polishing) is an important elemental technique in semiconductor process and regarded as an indispensable technique in particular to implement a multi-layer wiring structure for high-density wiring.

CMP covers a large variety of objects to process, examples of which include silicon dioxide ($SiO_2$) for an inter layer dielectrics or a buried dielectrics, a metal such as aluminum (Al), copper (Cu), and tungsten (W) used as a wiring layer or a plug to connect such a wiring layer, a barrier metal layer such as tantalum (Ta), tantalum, nitride (TaN), and titanium (Ti) used to prevent metals from diffusing, polysilicon used to form a trench capacitor, and silicon nitride (SiN) to be formed into an etching mask.

In order to carry out optimum polishing to these different kinds of objects, a polishing pad or a polishing composition must be optimized on an object-basis.

In the process of forming wirings in semiconductor process, RIE (Reactive Ion Etching) using a chlorine-based gas is carried, out to a silicon wafer, so that a groove corresponding to a desired wiring pattern and a hole corresponding to a desired plug are formed. A barrier layer made of titanium or titanium nitride is then formed on inner wall surfaces of the groove and the hole, then the entire substrate surface is coated with a wiring metal such as a tungsten layer by plating or the like, so that the groove and the hole are filled with tungsten and then an excess part of the tungsten layer in a region other than the groove and the hole is removed by CMP.

During etching to form such a groove or hole in a silicon wafer, an etching mask is formed on the surface of the wafer, and a silicon nitride layer is used as the etching mask. The etching mask itself is partly removed during etching, and the remaining part of the layer is coated with a wiring metal by plating and must be removed simultaneously with the metal layer by CMP.

The silicon nitride layer used as the etching mask however has a very high mechanical strength, and therefore the polishing speed for the silicon nitride by CMP is low (see Patent Document 1). This could prolong the polishing process.

Because of this problem, the silicon nitride layer is etched away. The etching is carried out by dry or wet process but even in wet process that allows the working time to be relatively shortened requires operation such as heating an etching agent to a high temperature (see Patent Document 2), which prolongs the polishing process and lowers the throughput of the semiconductor process.

Furthermore, a large variety of objects are processed by CMP as described above, and when objects such as a metal layer, an insulating layer, and a silicon nitride layer are processed, it is important to control not only a polishing speed for each of the layers but also selectivity as a ratio between two polishing speeds. Depending on the purpose of processing, the polishing speeds are approximately the same, in other words, the selectivity between them is preferably 1 in some cases, while one of the polishing speeds is preferably higher or lower than the other, in other words, the selectivity between them is preferably greater or smaller than 1 in other cases.

Therefore, the selectivity must be controlled to take various values rather than simply being set to a particular value.

However, in a conventional composition for polishing a silicon nitride layer, two polishing speeds both change in response to a change in the composition, so that it is difficult to control the selectivity to a desired ratio or if possible the polishing speeds themselves are greatly lowered. In other words, sufficient control cannot be achieved.

PRIOR ART DOCUMENTS

Patent Document 1: JP 2000-109795 A
Patent Document 2: JP 9-45660 A

SUMMARY OF THE INVENTION

Problems to be Solved by the Invention

It is an object of the present Invention to provide a composition for polishing silicon nitride that can improve a polishing speed for a silicon nitride by CMP in semiconductor process. Another object of the invention is to provide a method of controlling a selectivity that allows a selectivity based on a polishing speed for a silicon nitride layer to be readily controlled.

Means for Solving the Problems

A composition for polishing silicon nitride according to the present invention includes 1) colloidal silica, and 2) a polishing aid including a phosphoric acid compound and a sulfuric acid compound.

According to the present invention, the phosphoric acid compound includes at least one selected from phosphoric acid, pyrophosphoric acid, and polyphosphoric acid.

According to the invention, said colloidal silica has an average grain size of 15 nm to 80 nm.

The composition according to the present invention further includes an oxidizing agent.

The composition for polishing silicon nitride according to the present invention includes 1) colloidal silica, 2) a polishing aid including a phosphoric acid compound and a sulfuric acid compound, and 3) an oxidizing agent, and a first selectivity and a second selectivity can be controlled depending on the content of the oxidizing agent and the pH of the composition for polishing silicon nitride. The first selectivity represents a ratio of a polishing speed for a metal layer to a polishing speed for a silicon nitride layer and the second selectivity represents a ratio of a polishing speed for an oxide insulating layer to a polishing speed for a silicon nitride layer.

The present invention provides a method of controlling a selectivity using the composition for polishing silicon nitride that includes the above-described oxide agent, said first selectivity is controlled depending on the content of said oxidizing agent and said second selectivity is controlled depending on the pH of said composition for polishing silicon nitride.

Effects of the Invention

According to the present invention, a polishing speed for a silicon nitride layer can be improved by including colloidal silica and a polishing aid that includes a phosphoric acid compound and a sulfuric acid compound.

According to the present invention, at least one selected from phosphoric acid, pyrophosphoric acid, and polyphosphoric acid is preferably used as said phosphoric acid compound.

According to the present invention, silica is preferably used as said abrasive.

According to the present invention, by further adding an oxidizing agent, a metal layer can be polished and a polishing speed for the metal layer can be controlled depending on the content of the oxidizing agent without changing a polishing speed for silicon nitride.

According to the present invention, the composition includes colloidal silica, a polishing aid including a phosphoric acid compound and a sulfuric acid compound, and an oxidizing agent. At the time, a first selectivity as the ratio of a polishing speed for a metal layer to a polishing speed for a silicon nitride layer and a second selectivity as the ratio of a polishing speed for an oxide insulating layer to a polishing speed for the silicon nitride layer can be controlled depending on the content of said oxidizing agent and the pH of said composition for polishing silicon nitride.

The present invention provides a method of controlling a selectivity using a composition for polishing silicon nitride including the above-described oxidizing agent, said first selectivity can be controlled readily depending on the content of said oxidizing agent and said second selectivity can be controlled readily depending on the pH of said composition for polishing silicon nitride.

BRIEF DESCRIPTION OF THE DRAWINGS

Other features, elements, steps, characteristics and advantages of the present invention will become more apparent from the following detailed description with reference to the attached drawings.

FIG. 8 is a graph showing the effect of the content of the oxidizing agent on a polishing speed R1 for a silicon nitride layer.

FIG. 13 is a graph showing the effect of pH on a polishing speed R1 for a silicon nitride layer.

MODE FOR CARRYING OUT THE INVENTION

Figure 1:
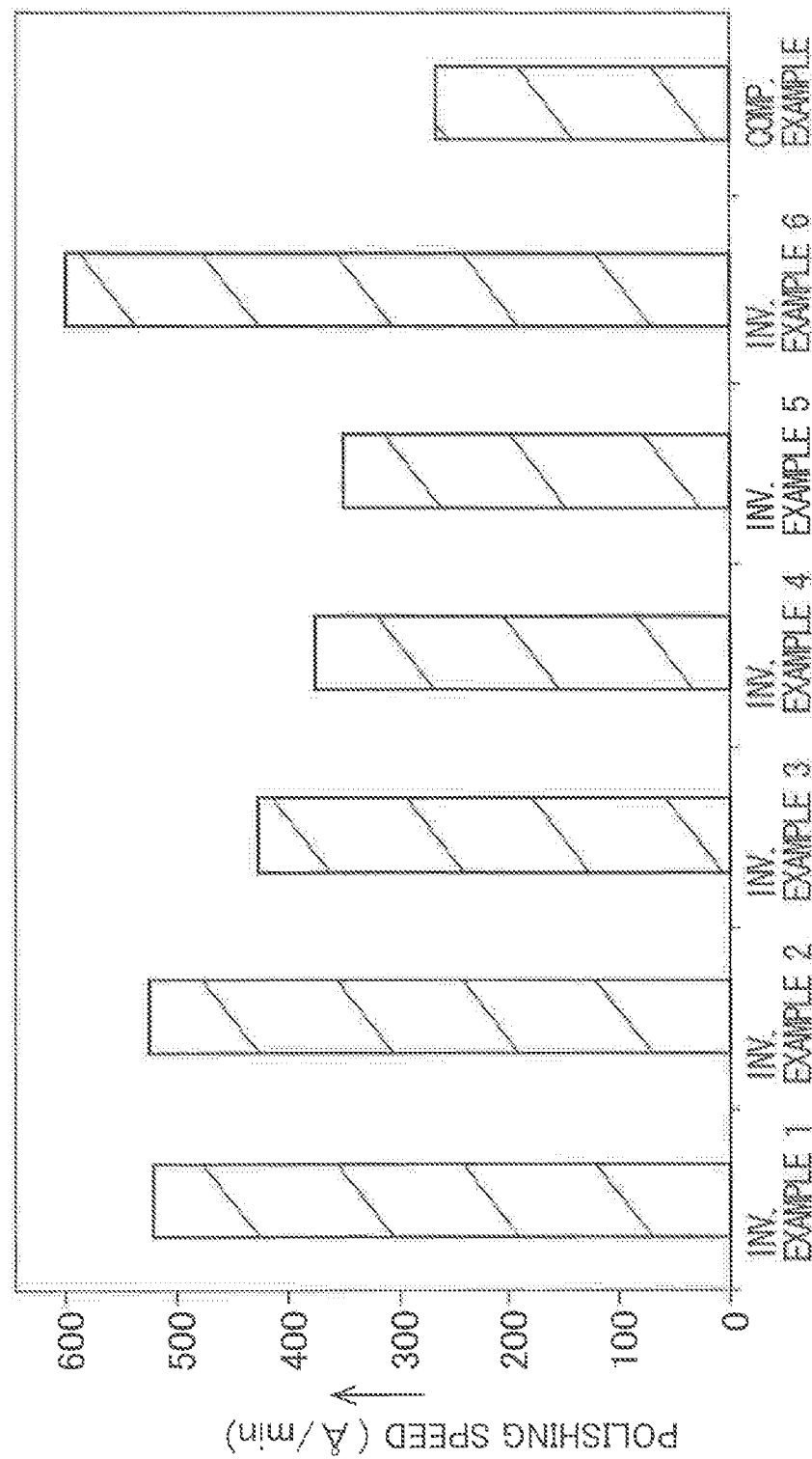
FIG. 1 is a graph showing a polishing speed for a silicon nitride layer in each of Inventive Examples 1 to 6 and Comparative Example.

Now, a preferred embodiment of the present invention will be described in conjunction with the accompanying drawings.

Silicon nitride is a material whose structure is $Si_3N_4$, and its sintered form has a large bending strength even at high temperatures. The material has a high wear resistance. In semiconductor process, the silicon nitride is the material useful as an insulating layer, an etching mask, and a protection layer for a self-align contact, but a high polishing speed does not result because of its high mechanical strength.

The present invention is particularly advantageously applied to polishing of such a silicon nitride layer and can sufficiently address polishing of a metal layer which is carried out simultaneously with polishing of the silicon nitride layer.

A composition for polishing silicon nitride according to the present invention includes colloidal silica, and a polishing aid that includes a phosphoric acid compound and a sulfuric acid compound, and the polishing speed for the silicon nitride layer can be improved by including them.

Now, a composition for polishing silicon nitride according to the present invention will be described in detail.

The phosphoric acid compound included in the composition for polishing silicon nitride according to the present invention is preferably at least one selected from phosphoric acid, pyrophosphoric acid, and polyphosphoric acid, and salts of the above, more preferably pyrophosphoric acid.

By including the polishing aid containing at least one selected from the group consisting of a phosphoric acid compound and a sulfuric acid compound, a polishing speed for a silicon nitride layer improves and the use of pyrophosphoric acid, a salt thereof, and/or sulfuric acid in particular further improves the polishing speed.

The average grain size of silica is not particularly limited but colloidal silica, having an average grain size from 15 nm to 80 nm obtained by particle size distribution measurement by light scattering is preferably applied, and the size is more preferably from 30 nm to 70 nm.

When the average grain size is from 15 nm to 80 nm, the polishing speed for a silicon nitride layer can be improved significantly. If the average grain size is outside the range, the polishing speed is improved but its improvement is less than that when the size Is within the above-described range.

When the average grain size is from 30 nm to 70 nm, the polishing speed for a silicon nitride layer can be improved more significantly.

The pH of the composition for polishing silicon nitride is controlled by adding a pH modifier such as organic acid or inorganic acid, examples of which include nitric acid, hydrochloric acid, acetic acid, lactic acid, citric acid, tartaric acid, and malonic acid. Nitric acid is most preferably applied among the above.

The composition for polishing silicon nitride according to the present invention may include an additive in addition to the above composition.

Examples of the additive include citric acid, lactic acid, and potassium hydrogen phthalate. By including any of these additives, the polishing speed for a silicon nitride layer can be further improved.

As another kind of additive, one or more of additives normally used for a conventional polishing composition in the field may be added as far as the preferable characteristic of the polishing compound is not degraded.

The composition for polishing silicon nitride according to the present invention may further include an oxidizing agent.

As described above, a silicon nitride layer is sometimes polished simultaneously with wiring metal such as tungsten and a barrier metal layer such as titanium, and therefore the composition for polishing silicon nitride preferably has sufficient polishing speeds for the metal layers.

In order to improve polishing speeds for metal layers or the like, the composition for polishing silicon nitride may further include an oxidizing agent.

Examples of the oxidizing agent included in the composition for polishing silicon nitride according to the present invention include chloric acid, bromic acid, iodic acid, periodic acid, and a persulfuric acid compound, and salts of the above, and a combination of hydrogen peroxide and ferric nitrate. A potassium salt, a sodium salt, and a calcium salt are preferably applied as such a salt. Iodic acid and periodic acid are particularly preferably applied as such an oxidizing agent in order to prevent alkali or alkaline earth metal from being contaminated.

It has been known that the addition of an oxidizing agent has no effect on polishing speeds for a silicon nitride layer and an oxide insulating layer such as a silicon dioxide layer. When the amount of the oxidizing agent to be added is changed, the polishing speeds for the silicon nitride layer and the silicon dioxide layer do not change and only the polishing speeds for the metal layers change. Therefore, by changing the adding amount of the oxidizing agent, selectivities represented as the ratios of the polishing speeds for the silicon nitride layer and the silicon dioxide layer and the polishing speeds for the metal layers can be controlled.

Therefore, the content of the oxidizing agent in the composition for polishing silicon nitride according to the present invention may be determined as required in consideration of the polishing speeds for the metal layers or selectivities.

It has been known that a change in the pH of the composition for polishing silicon nitride has no effect on the polishing speeds for the silicon nitride layer and the metal layers, so that when the pH of the composition for polishing silicon nitride is changed, the polishing speeds for the silicon nitride layer and the metal layers do not change while only the polishing speed for the silicon dioxide layer changes. Therefore, a selectivity represented as the ratio of the polishing speeds for the silicon nitride layer and the metal layer and the polishing speed for the silicon dioxide layer can be controlled.

In this way, the composition for polishing silicon nitride according to the invention can easily control a first selectivity as the ratio of a polishing speed for a metal layer relative to a polishing speed for a silicon nitride layer and a second selectivity as the ratio of a polishing speed for an oxide insulating layer relative to the polishing speed for the silicon nitride layer based on the content of an oxidizing agent and the pH of the composition for polishing silicon nitride.

In the following, a method of controlling the first selectivity depending on the content of an oxidizing agent and a second selectivity depending on the pH of the composition for polishing silicon nitride will be described.

When a silicon nitride layer, a metal layer, an oxide insulating layer are polished using the composition for polishing silicon nitride including an oxidizing agent according to the present invention, R1 represents a polishing speed for the silicon nitride layer, R2 represents a polishing speed for the metal layer, and R3 represents a polishing speed for the oxide insulating layer. Then, the ratio of the polishing speed R2 for the metal layer relative to the polishing speed R1 for the silicon nitride layer is a first selectivity R2/R1 and the ratio of the polishing speed R3 for the oxide insulating layer relative to the polishing speed R1 for the silicon nitride layer is a second selectivity R3/R1.

Here, only the polishing speed R2 for the metal layer can be changed by changing the content of the oxidizing agent. Since the polishing speed R1 for the silicon nitride layer is substantially constant, the first selectivity R2/R1 is determined only based on the polishing speed R2 for the metal layer. More specifically, the first selectivity E2/R1 can be changed simply by changing the content of the oxidizing agent, so that the selectivities can be controlled easily.

Only the polishing speed R3 for the oxide insulating layer can be changed by changing the pH of the composition for polishing silicon nitride. Since the polishing speed R1 for the silicon nitride layer is substantially constant, the second selectivity R3/R1 is determined based only on the polishing speed R3 for the oxide insulating layer. More specifically, the second selectivity R3/R1 can be changed simply by changing the pH of the composition for polishing silicon nitride, so that the selectivities can be controlled easily.

When the metal layer is composed of a polysilicon layer and the content of the oxidizing agent is changed in the range from 0 wt % to 0.17 wt %, the polishing speed R1 for the silicon nitride layer is substantially constant and only the polishing speed R2 for the metal layer changes. At the time, the first selectivity R2/R1 is from 0.29 to 1.77 and can be controlled to be a value less than or not less than 1.

When the oxide insulating layer is a TEOS layer and the pH of the composition for polishing silicon nitride is changed in the range from 2.5 to 5.5, the polishing speed R1 for the silicon nitride layer is substantially constant and only the polishing speed R3 for the oxide insulating layer changes. At the time, the second selectivity R3/R1 is from 0.63 to 1.41 and can be controlled to be a value less than or not less than 1.

The remainder of the composition for polishing silicon nitride according to the invention is water, and the kind of water is not specifically limited, but pure water, ultrapure water, ion exchanged water, and distilled water are preferable in consideration of use in a semiconductor device manufacturing process.

An existing method of manufacturing a polishing composition can be employed as a method of manufacturing a composition for polishing silicon nitride according to the present invention. Note that the composition for polishing silicon nitride according to the present invention can be diluted to have an arbitrary concentration when it is used.

EXAMPLES

In the following, inventive examples and comparative examples will be described.

Inventive examples and a comparative example were produced to have the following compositions.

| Inventive Example 1 | |
|---|---|
| Abrasive: colloidal silica | 6.0 wt % |
| Polishing aid: pyrophosphoric acid | 0.25 wt % |
| Inventive Example 2 | |
| Abrasive: colloidal silica | 6.0 wt % |
| Polishing aid: sulfuric acid | 0.25 wt % |
| Inventive Example 3 | |
| Abrasive: colloidal silica | 6.0 wt % |
| Polishing aid: potassium pyrophosphate | 0.25 wt % |
| Inventive Example 4 | |
| Abrasive: colloidal silica | 6.0 wt % |
| Polishing aid: phosphoric acid | 0.25 wt % |
| Inventive Example 5 | |
| Abrasive: colloidal silica | 6.0 wt % |
| Polishing aid: polyphosphoric acid | 0.25 wt % |
| Inventive Example 6 | |
| Abrasive: colloidal silica | 6.0 wt % |
| Polishing aid: pyrophosphoric acid | 0.25 wt % |
| Polishing aid: sulfuric acid | 0.25 wt % |
| Comparative Example | |
| Abrasive: colloidal silica | 6.0 wt % |

The colloidal silica in inventive Examples 1 to 6 and Comparative Example had an average grain size of 34 nm.

In Inventive Examples 1 to 6 and Comparative Example, the pH was controlled to be 1.5 using nitric acid.

Among Inventive Examples 1 to 5, the kind of phosphoric acid compound was varied, in Inventive Example 6, both pyrophosphoric acid as a phosphoric acid compound and sulfuric acid as a sulfuric acid compound were used, and Comparative Example was the same as the inventive examples except that it did not include any polishing aid.

Using each of Inventive Examples 1 to 6 and Comparative Example described above, a polishing speed for a silicon nitride layer was measured. Polishing conditions and a method of evaluating polishing speeds are as follows.

Polishing Conditions
Substrate to be polished: silicon nitride substrate
Polisher: EcoMet 3 (manufactured by BUEHLER)
Polishing pad: IC1400-K·grv. (Nitta Haas Incorporated)
Platen rotation speed: 120 (rpm)
Carrier rotation speed: 40 (rpm)
Polishing load surface pressure: 345 (hPa)
Flow rate of composition for polishing semiconductor: 30 (ml/min)
Polishing time: 60 (s)
Polishing Rate The polishing rate is represented by the thickness of each layer removed by polishing per unit time (Å/min). The thickness of the layer removed by polishing was calculated by subtracting the thickness of the layer after polishing from the thickness of the layer before polishing. The thickness of a metal layer was measured using OmniMap ES35c manufactured by KLA-Tencor Corporation, and the thickness of a non-metal layer was measured using a Nanospec/AFT5100 manufactured by NANOMETRICS Incorporated.

FIG. 1 is a graph showing polishing speeds for silicon nitride layers in Inventive Examples 1 to 6 and Comparative Example. The ordinate represents a polishing speed (Å/min) for the silicon nitride layers.

As can be understood from the graph, in Inventive Examples 1 to 6 including a phosphoric acid compound, the polishing speed, was higher than Comparative Example without the compound. The polishing speed was high particularly in Inventive Example 1 including pyrophosphoric acid and Example 2 including sulfuric acid and ever higher in Inventive Example 6 including both pyrophosphoric acid and sulfuric acid.

Content of Pyrophosphoric Acid

The content of pyrophosphoric acid that is a phosphoric acid compound as a polishing aid was studied.

The content of the pyrophosphoric acid based on the composition in Inventive Example 1 was changed from 0.0 wt % to 2.0 wt % and the polishing speeds for the silicon nitride layers were measured. The polishing conditions were the same as the above. Note that the case in which the content of the pyrophosphoric acid is 0 wt % corresponds to Comparative Example.

Figure 2:
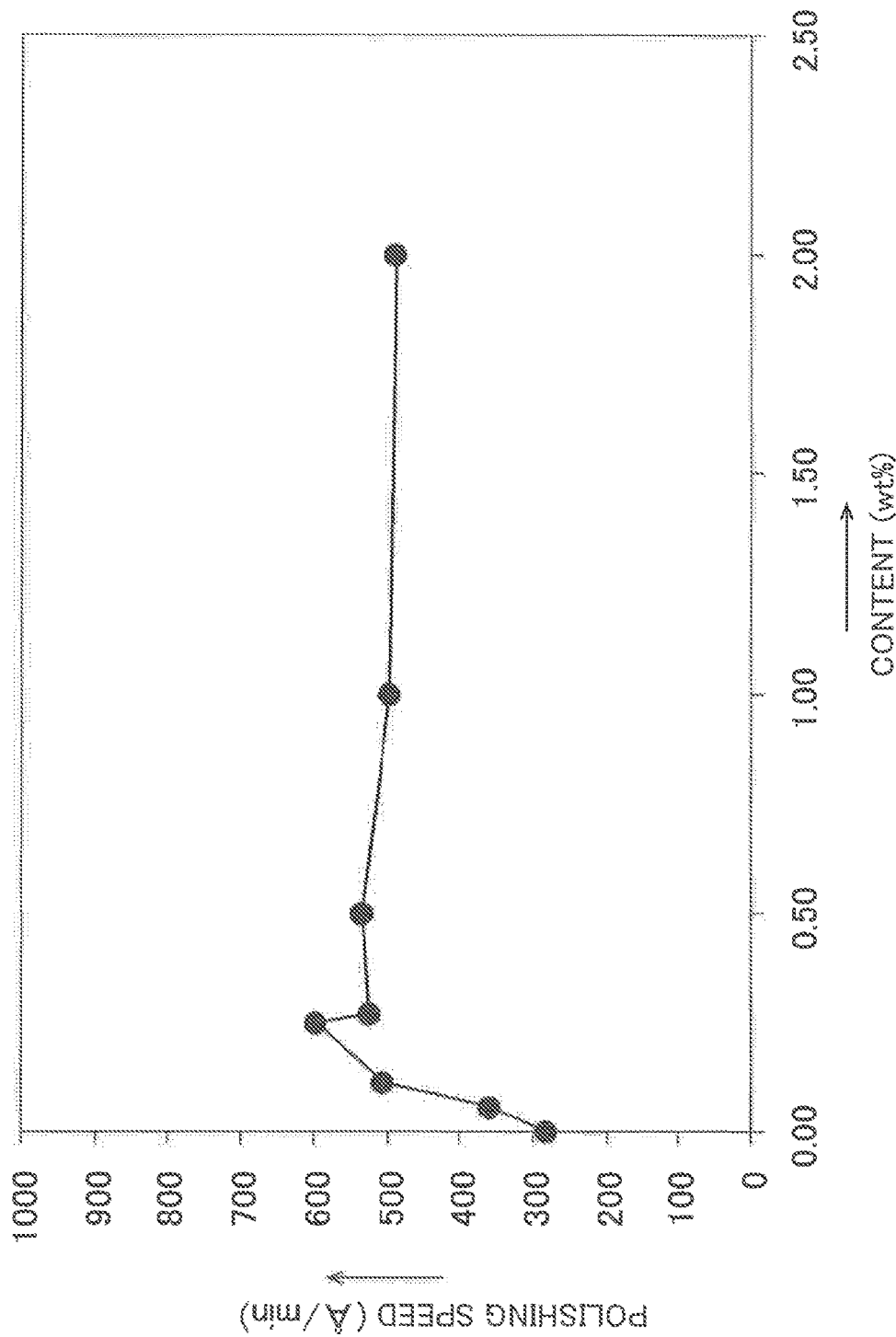
FIG. 2 is a graph showing the effect of the content of pyrophosphoric acid on a polishing speed for a silicon nitride layer.

FIG. 2 is a graph showing the effect of the content of pyrophosphoric acid on the polishing speed for a silicon nitride layer. The abscissa represents the content of the pyrophosphoric acid (wt %) and the ordinate represents the polishing speed (Å/min) for the silicon nitride layer.

The polishing speed for the silicon, nitride layer can be improved simply by adding pyrophosphoric acid, and when the content is not less than 0.1 wt %, more significant improvement results.

Silica Average Grain Size

The average grain size of colloidal silica was studied.

The average grain size of colloidal silica based on the composition in Inventive Example 1 was changed among 16 nm, 33 nm, 67 nm, and 77 nm, and when the colloidal silica with each grain size is used, the polishing speed for the silicon nitride layers was measured. The polishing conditions were the same as the above.

The average grain size of colloidal silica was obtained by particle size distribution measurement according to light scattering (using a particle size measurement system ELS-Z2 manufactured by Otsuka Electronics Co., Ltd.).

Figure 3:
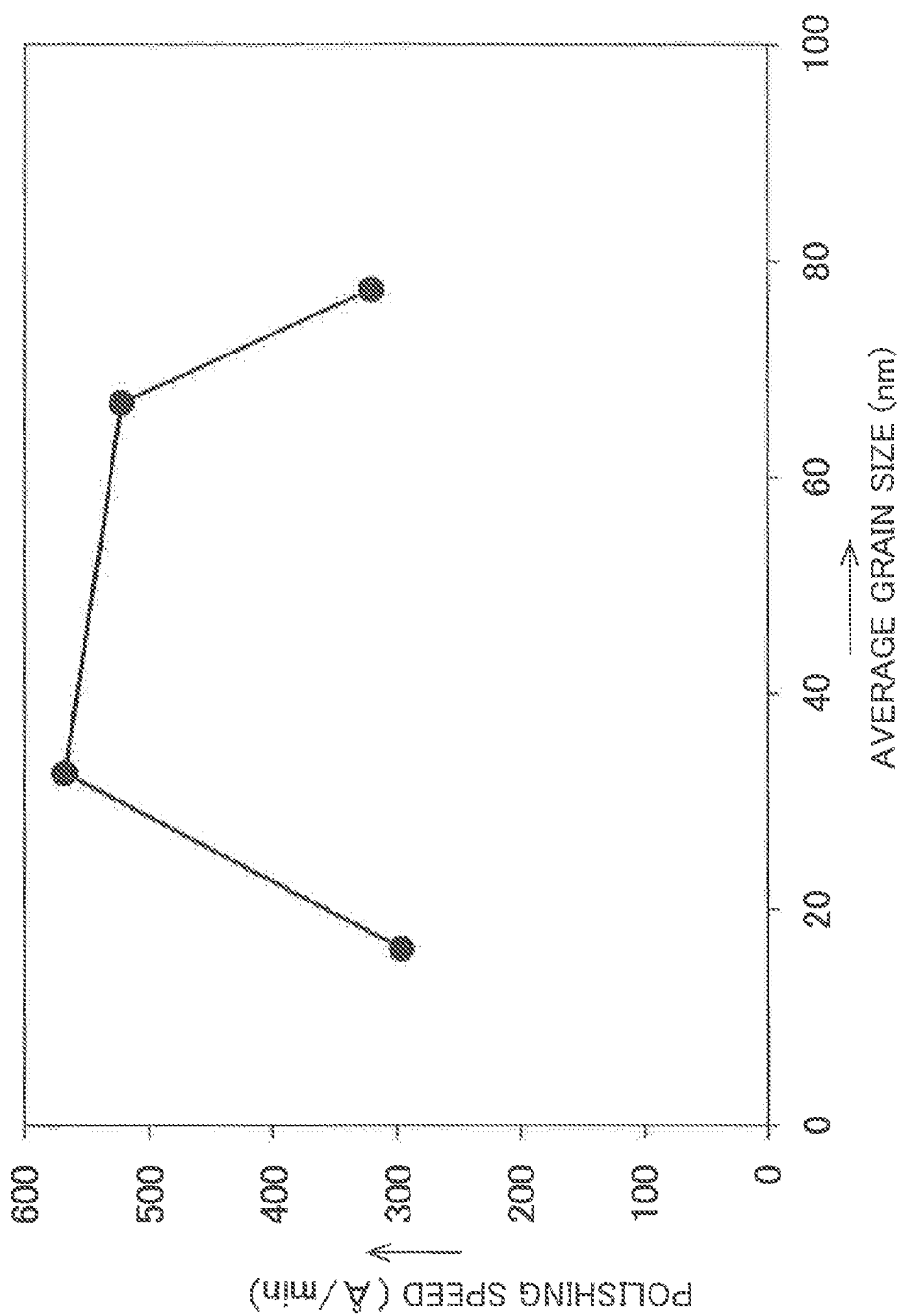

FIG. 3 is a graph showing the effect of the average grain size of colloidal silica on a polishing speed for the silicon nitride layer. The abscissa represents the average grain size (nm) of colloidal silica and the ordinate represents a polishing speed (Å/min) for a silicon nitride layer.

When the average grain size of colloidal silica is from 15 nm to 80 nm, the polishing speed for the silicon nitride layer can be improved significantly and the speed can be improved even more significantly when the average grain size of colloidal silica is from 30 nm to 70 nm. It was found that the polishing speed was improved even outside the range from 15 nm to 80 nm.

Effects of Additives

Polishing speeds were studied when citric acid, lactic acid, and potassium hydrogen phthalate were added as additives.

Inventive Example 7 was the same as Inventive Example 1 except that citric acid was newly added as an additive.

Inventive Example 8 was the same as Inventive Example 1 except that lactic acid was further added as an additive. Inventive Example 9 was the same as Inventive Example 1 except that potassium hydrogen phthalate was further added as an additive. The contents of the additives were each 0.25 wt %.

Figure 4:
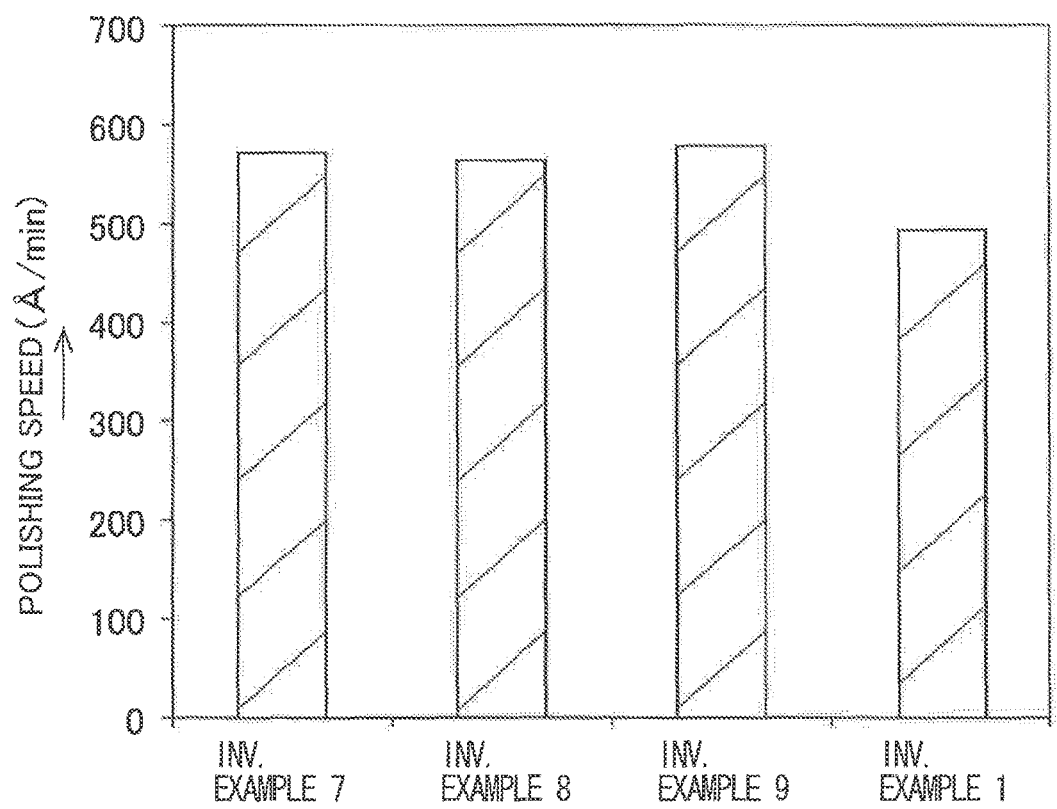
FIG. 4 is a graph showing a polishing speed for a silicon nitride layer in each of Inventive Examples 7 to 9.

FIG. 4 is a graph showing polishing speeds for silicon nitride layers in Inventive Examples 7 to 9. The ordinate represents the polishing speeds for silicon nitride (Å/min). For a comparison purpose, a polishing speed in Inventive Example 1 was also shown.

Inventive Examples 7 to 9 including citric, acid, lactic acid, and potassium hydrogen phthalate had a polishing speed even higher than that of Inventive Example 1.

Effect of Etching

Now an etching rate was measured in order to ascertain that the removal of silicon nitride was caused by the composition for polishing silicon nitride according to the present invention and not by etching.

A silicon nitride layer was immersed in a composition for polishing a silicon nitride layer and an etching rate was calculated by subtracting the layer thickness after the immersion from the layer thickness before the immersion and dividing the obtained value by immersion time (min).

It has been found from the measurement that the etching rate of the silicon nitride layer by the composition for polishing silicon nitride according to the present invention was zero by immersion for two minutes. This shows that removal of the silicon nitride by the composition for polishing silicon nitride according to the present invention was caused by CMP and not by etching.

Addition of Oxidizing Agent

Polishing speeds for a metal layer (tungsten), a TEOS layer, and a silicon nitride layer were studied after iodic acid, periodic acid, and a mixture of hydrogen peroxide and ferric nitrate were added.

In the polishing conditions described above, only the use of the tungsten substrate, the TEOS substrate, or the silicon nitride substrate as a substrate to be polished is different.

Inventive Example 10 is the same as Inventive Example 1 except that 0.15 wt % of iodic acid was added. Inventive Example 11 was the same as Inventive Example 1 except that 0.19 wt % of periodic acid was added. Inventive Example 12 was the same as Inventive Example 1 except that a mixture of 4.0 wt % of hydrogen peroxide and 0.02 wt % of ferric nitrate was further added.

Figure 5:
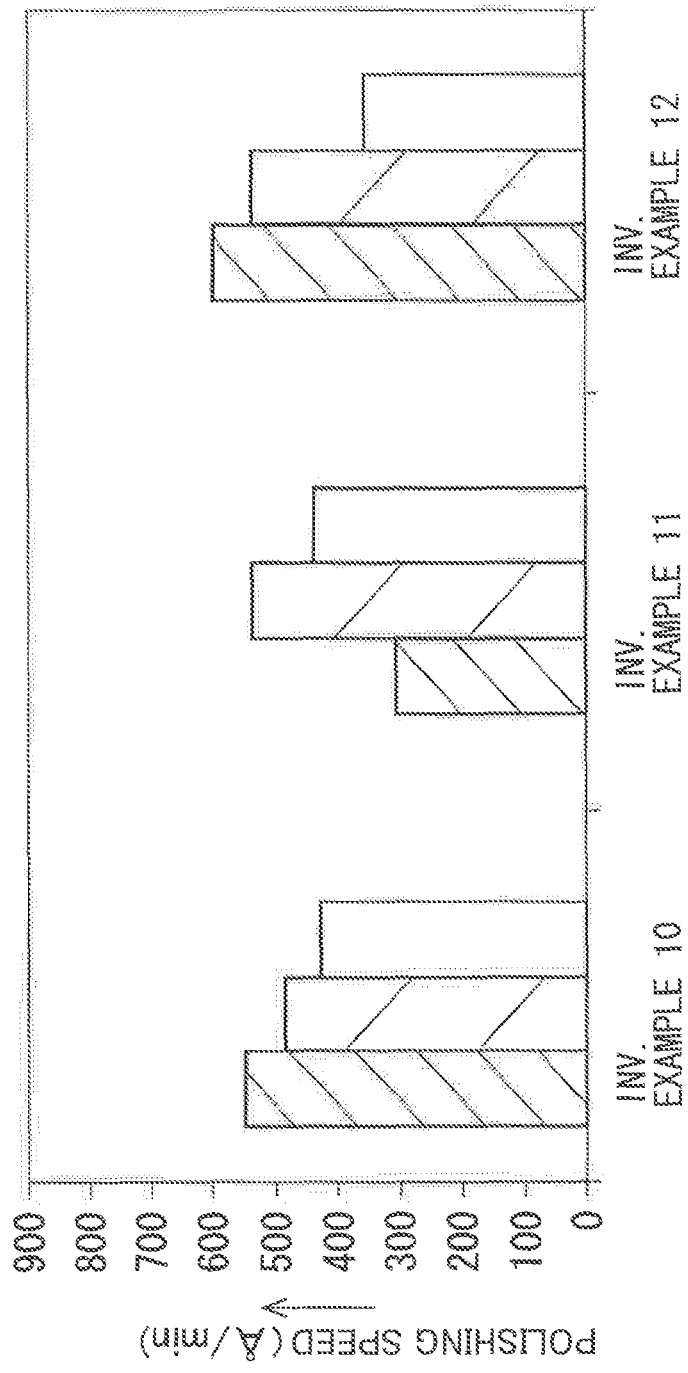
FIG. 5 is a graph showing polishing speeds for a metal layer (tungsten), a TEOS layer, and a silicon nitride layer in Inventive Examples 10 to 12.

FIG. 5 is a graph showing polishing speeds for the metal layer (tungsten), the TEOS layer, and the silicon nitride layer in Inventive Examples 10 to 12. The ordinate represents a polishing speed (Å/mm) for each layer. The graph indicates, sequentially from the left, the polishing speeds for the tungsten layer, the TEOS layer, and the silicon nitride layer.

As shown in FIG. 5, using the composition for polishing silicon nitride including an oxidizing agent according to the present invention, the metal layer (tungsten), the TEOS layer, and the silicon nitride layer can be polished simultaneously.

Content of Oxidizing Agent

The effect of the content of the oxidizing agent was also studied.

Based on the composition according to inventive Example 10, the content of the oxidizing agent was changed among 0.05 wt % (Inventive Example 13), 0.1 wt % (Inventive Example 14), 0.175 wt % (Inventive Example 15), and 0.25 wt % (inventive Example 16), and polishing speeds for a metal layer (tungsten), a TEOS layer, and a silicon nitride layer were measured.

Figure 6:
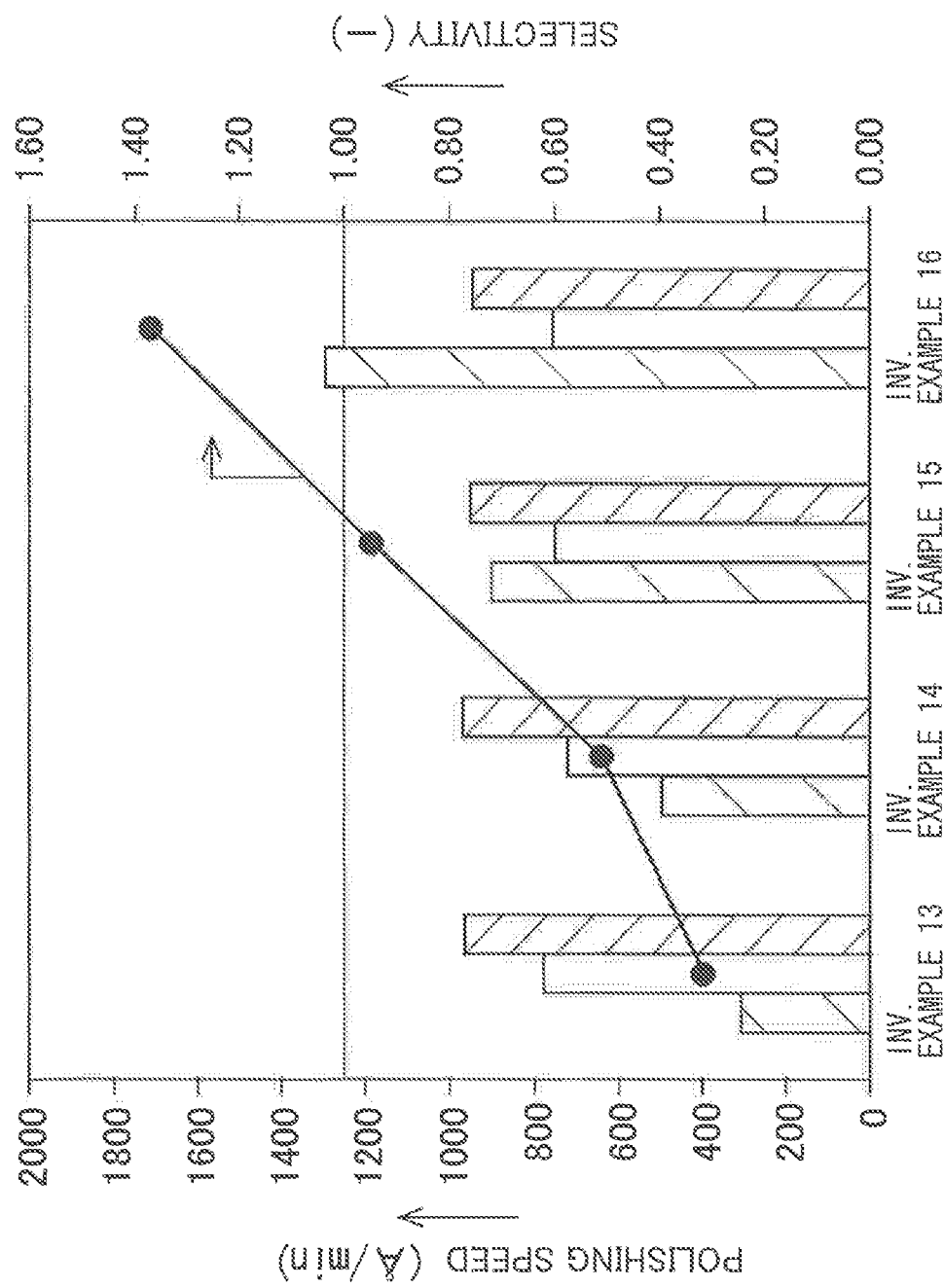
FIG. 6 is a graph showing the effect of the content of an oxidizing agent on a polishing speed for each of the layers.

FIG. 6 is a graph showing the effect of the content of the oxidizing agent on polishing speeds (Å/min) for the layers. The abscissa represents the content of the oxidizing agent (wt %), and the left ordinate represents the polishing speed (Å/min) for each layer, and the right ordinate represents selectivity.

The graph indicates, sequentially from the left for each example, the polishing speeds for the tungsten layer, the silicon nitride layer, and the TEOS layer. The selectivity is the ratio of the polishing speed for the TEOS layer to the polishing speed for the tungsten layer. When the selectivity equals 1.0, the polishing speeds for the TEOS layer and the tungsten layer were the same.

As can be understood from the graph, the polishing speeds for the silicon nitride layer and the TEOS layer did not change if the content of the oxidizing agent is changed. It was found that the polishing speed for the tungsten layer changed depending on the content of the oxidizing agent and increased as the content increased.

Therefore, it was found that by changing the content of the oxidizing agent, the polishing speed for the metal layer can be changed and the selectivity can be controlled while keeping the polishing speeds for the silicon nitride layer and the TEOS layer fixed.

Furthermore, the selectivity can be controlled to be a value less than or not less than 1.

Control of the selectivity was further studied.

Using iodic acid as an oxidizing agent, a polishing speed R1 for a silicon nitride layer, a polishing speed R2 for a metal layer, and a polishing speed R3 for an oxide insulating layer (TEOS layer) were measured, and control of the first and second selectivities were studied.

First Selectivity

Control of the first selectivity R2/R1 as the ratio of the polishing speed E2 for the metal layer to the polishing speed R1 for the silicon nitride layer while the content of the oxidizing agent was varied was studied. The metal layers for an examination of the first selectivity included a polysilicon layer, a tungsten layer, and a titanium layer.

In the study of the first selectivity a composition with an addition of iodic acid as an oxidizing agent based on Inventive Example 6 was used. While the content of the oxidizing agent was varied among 0.04 wt % (Inventive Example 17), 0.08 wt % (Inventive Example 18), and 0.17 wt % (Inventive Example 19), the polishing speed R1 for the silicon nitride layer and the polishing speed R2s far the polysilicon layer and the polishing speed R3 for the TEOS layer were measured. The polishing conditions are as follows.

Polishing Conditions

Polisher-EPO222D (manufactured by Ebara Technologies, Inc.)

Polishing pad: IC1000-050-A2/S400 Perforate (manufactured by Nitta Haas Incorporated)

Platen, rotation speed: 80 (rpm)

Carrier rotation speed: 83 (rpm)

Polishing load surface pressure: 240 (hPa)

Flow rate of composition for polishing semiconductor: 150 (ml/min)

Polishing time: 60 (s)

Figure 7:
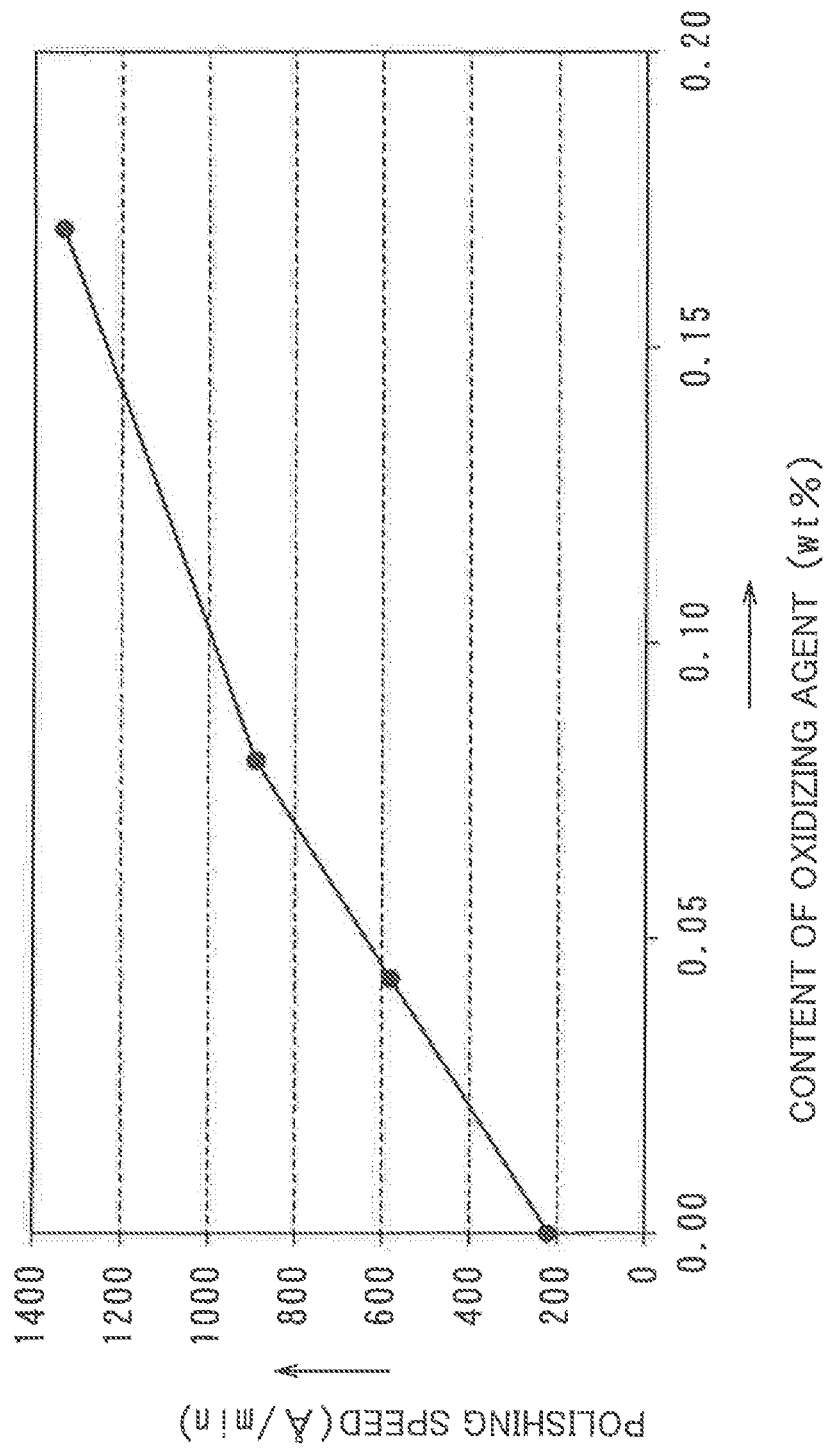
FIG. 7 is a graph showing the effect of the content of the oxidizing agent on a polishing speed R2s for a polysilicon layer.
Figure 8:
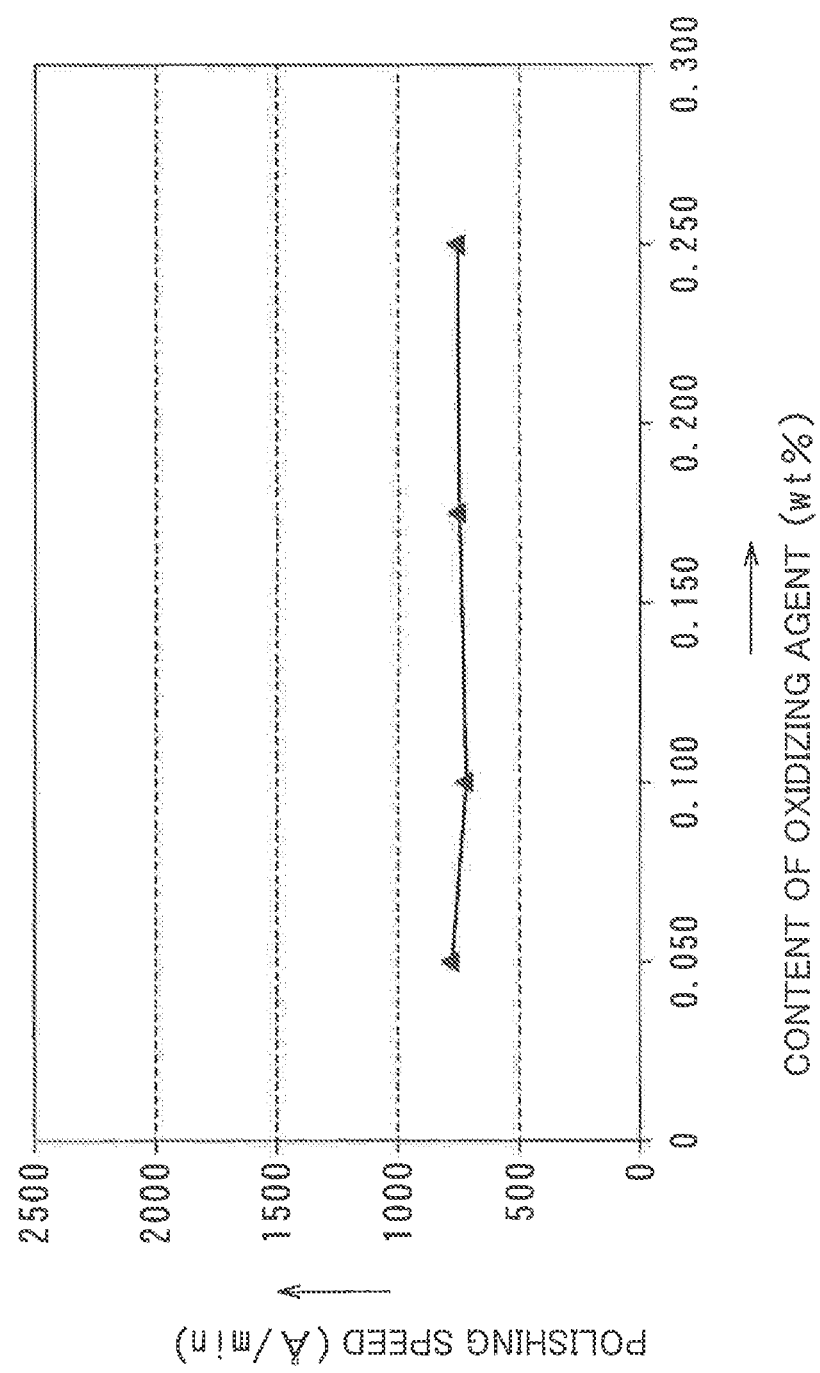
FIG. 8 is a graph showing the effect of the average grain size of colloidal silica on a polishing speed for a silicon nitride layer.
Figure 9:
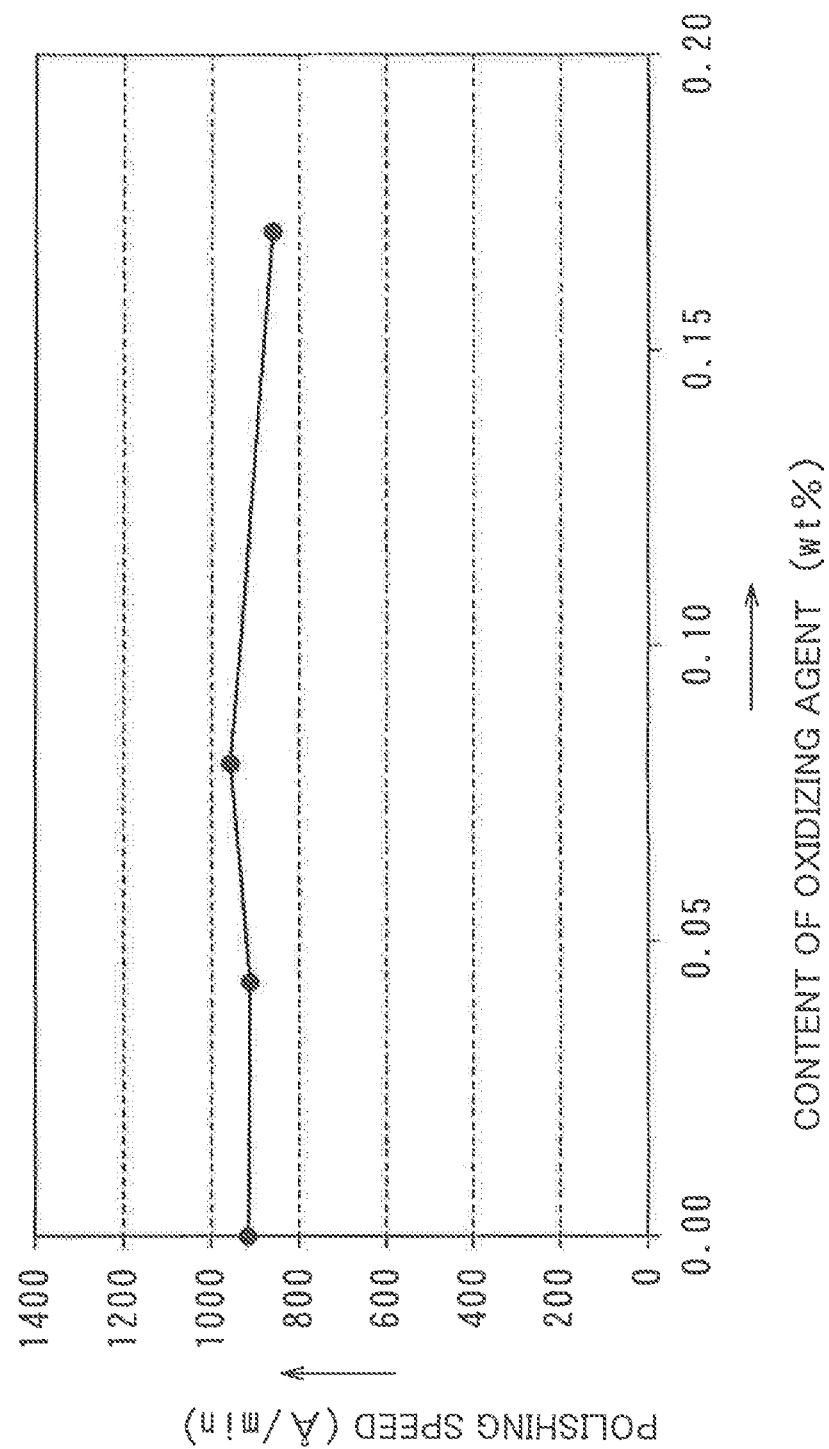
FIG. 9 is a graph showing the effect of an oxidizing agent on a polishing speed R3 for a TEOS layer.

FIG. 7 is a graph showing the effect of the content of the oxidizing agent on the polishing speed R2s for the polysilicon layer, FIG. 8 is a graph showing the effect of the content of the oxidizing agent on the polishing speed R1 for the silicon nitride layer, and FIG. 9 is a graph showing the effect of the content of the oxidizing agent on the polishing speed R3 for the TEOS layer. The abscissa represents the content (wt %) of the oxidizing agent and the ordinate represents the polishing speed (Å/min).

The polishing speed R2s for the polysilicon layer was 577 Å/min in Inventive Example 17, 887 Å/min in Inventive Example 18, and 1331 Å/min in Inventive Example 19. As can be understood from the graph in FIG. 7, as the concentration of the oxidizing agent increased, the polishing speed R2s was also raised. For reference, the polishing speed R2s for the polysilicon layer was 221 Å/min when the content of the oxidizing agent was zero.

Figure 11:
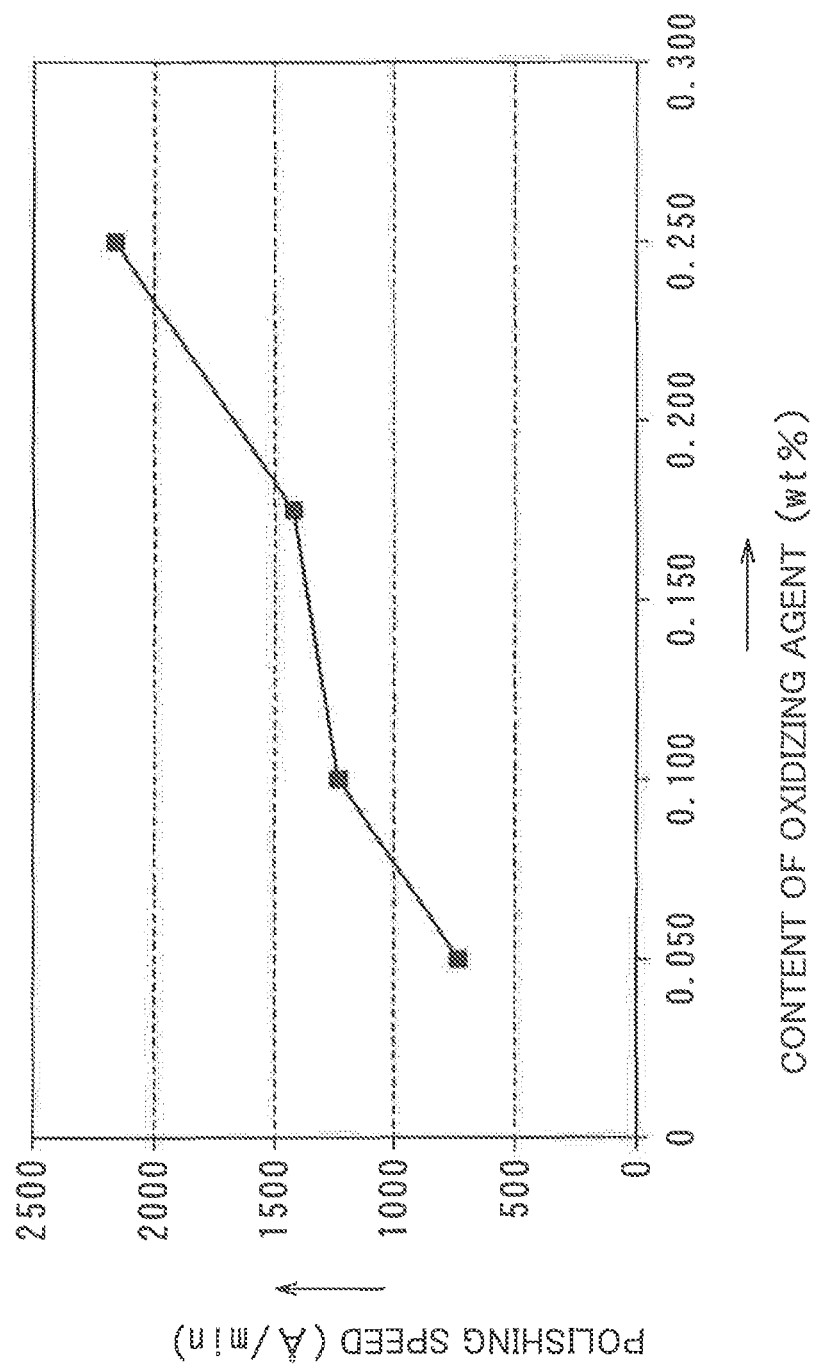
FIG. 11 is a graph showing the effect of the content of an oxidizing agent on a polishing speed R2t for a titanium layer.

The polishing speed R1 for the silicon nitride layer was the same as the result shown in FIG. 6 using Inventive Examples 13 to 18, and the result is shown again in the graph in FIG. 8. The measurement result of the polishing speed R3 for the TEOS layer using Inventive Examples 17 to 19 is shown in the graph in FIG. 11.

As can be understood from FIG. 8, the polishing speed R1 for the silicon nitride layer was substantially constant as the content of the oxidizing agent changed. As can be understood from FIG. 9, the polishing speed R3 for the TEOS layer was substantially constant as the content of the oxidizing agent changed.

In this way, the polishing speed R1 for the silicon nitride layer is substantially constant if the content of the oxidizing agent is changed, and therefore the first selectivity R2s/R1 can be controlled based on the polishing speed R2s for the polysilicon layer. The first selectivity R2s/R1 changed from 0.29 to 1.77 when the content of the oxidizing agent was changed from 0 to 0.17 wt %. Here, the polishing speed R1 for the silicon nitride layer was 750 Å/min.

It has been found that the first selectivity R2s/R1 can be controlled readily to a desired value in the range from 0.29 to 1.77 by changing only the content of the oxidizing agent.

Figure 10:
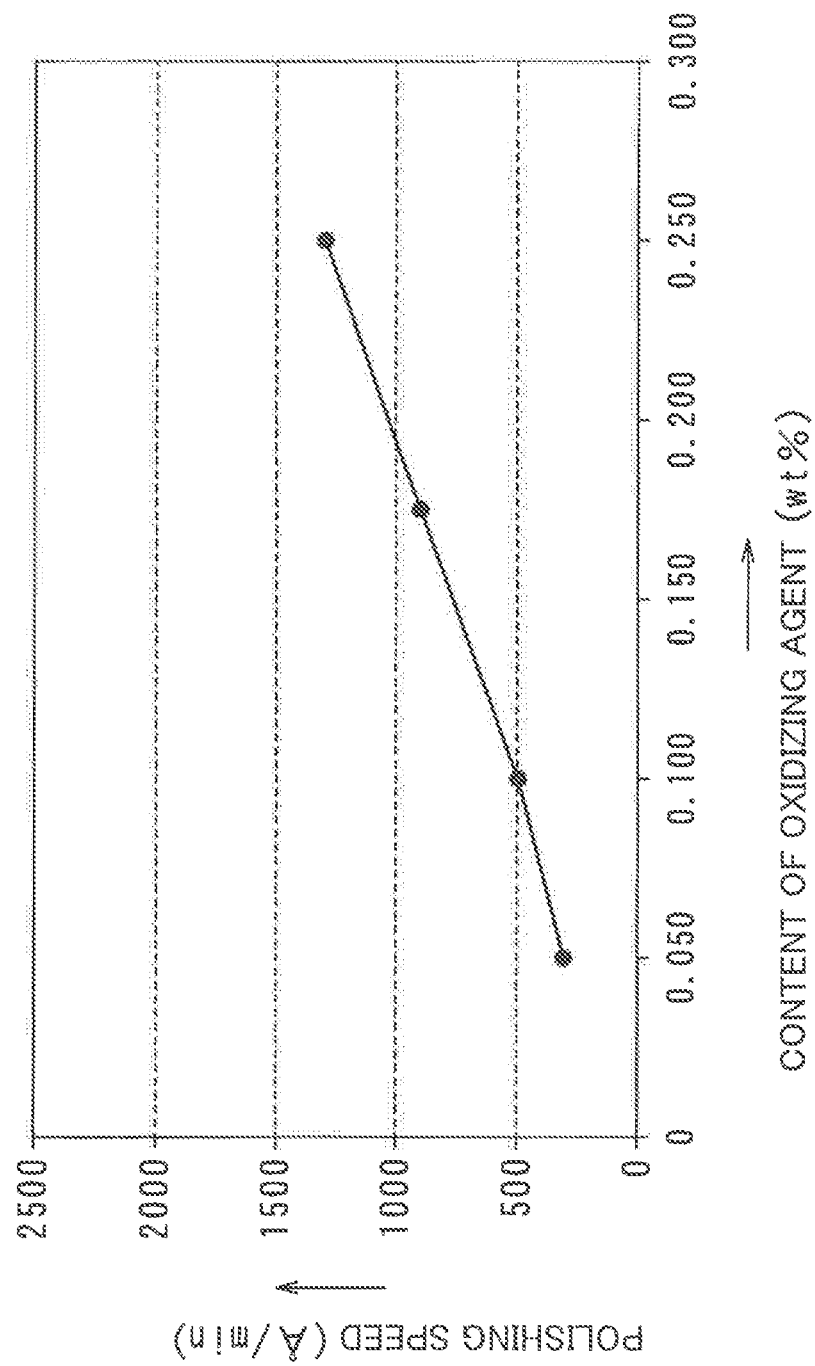
FIG. 10 is a graph showing the effect of the content of an oxidizing agent on a polishing speed R2w for a tungsten layer.

Furthermore, the polishing speed R2w for the tungsten layer and the polishing speed R2t for the titanium layer will be examined. The polishing speed R2w for the tungsten layer was the same as the result shown in FIG. 6 using Inventive Examples 13 to 16 and the result is given again as the graph shown in FIG. 10. A measurement result of the polishing speed R2t for the titanium layer using Inventive Examples 13 to 16 is given in the graph shown in FIG. 11.

The polishing speed R2w for the tungsten layer was 307 Å/min in Inventive Example 13, 496 Å/min in Inventive Example 14, 900 Å/min in Inventive Example 15, and 1294 Å/min in inventive Example 16. The polishing speed R2t for the titanium layer was 733 Å/min in Inventive Example 13, 123.1 Å/min in Inventive Example 14, 1421 Å/min in Inventive Example 15, and 2166 Å/min in Inventive Example 16. As can be understood from FIGS. 10 and 11, as the concentration of the oxidizing agent increased, the polishing speed R2w for the tungsten layer and the polishing speed R2t for the titanium layer were also raised.

The polishing speed R1 for the silicon nitride layer is substantially constant if the content of the oxidizing agent is changed, and therefore the first selectivity R2w/R1 can be controlled based on the polishing speed R2w for the tungsten layer. When the content of the oxidizing agent is changed from 0.05 wt % to 0.25 wt %, the first selectivity R2w/R1 changed from 0.39 to 1.71.

It has been found that the first selectivity R2w/R1 can be controlled readily to a desired value in the range from 0.39 to 1.71 by changing only the content of the oxidizing agent.

The first selectivity R2t/R1 can be controlled based on the polishing speed R2t. When the content of the oxidizing agent was changed from 0.05 wt % to 0.25 wt %, the first selectivity R2t/R1 changed from 0.94 to 2.87.

It has been found that the first selectivity R2t/R1 can be changed readily to a desired value in the range from 0.94 to 2.87 by changing only the content of the oxidizing agent.

Second Selectivity

Now, the second selectivity R3/R1 as the ratio of the polishing speed R3 for the TEOS layer to the polishing speed R1 for the silicon nitride layer when the pH was changed was studied.

In the study of the second selectivity, a composition produced by adding 0.08 wt % of iodic acid as an oxidizing agent to the composition of Inventive Example 6 was used. While the pH of the polishing composition was changed among 2.5 (Inventive Example 20), 3.5 (Inventive Example 21), 4.2 (Inventive Example 22), and 5.5 (inventive Example 23), the polishing speed R1 for the silicon nitride layer and the polishing speed R3 for the TEOS layer were measured. The polishing conditions are the same as those in the study of the first selectivity described above.

Figure 12:
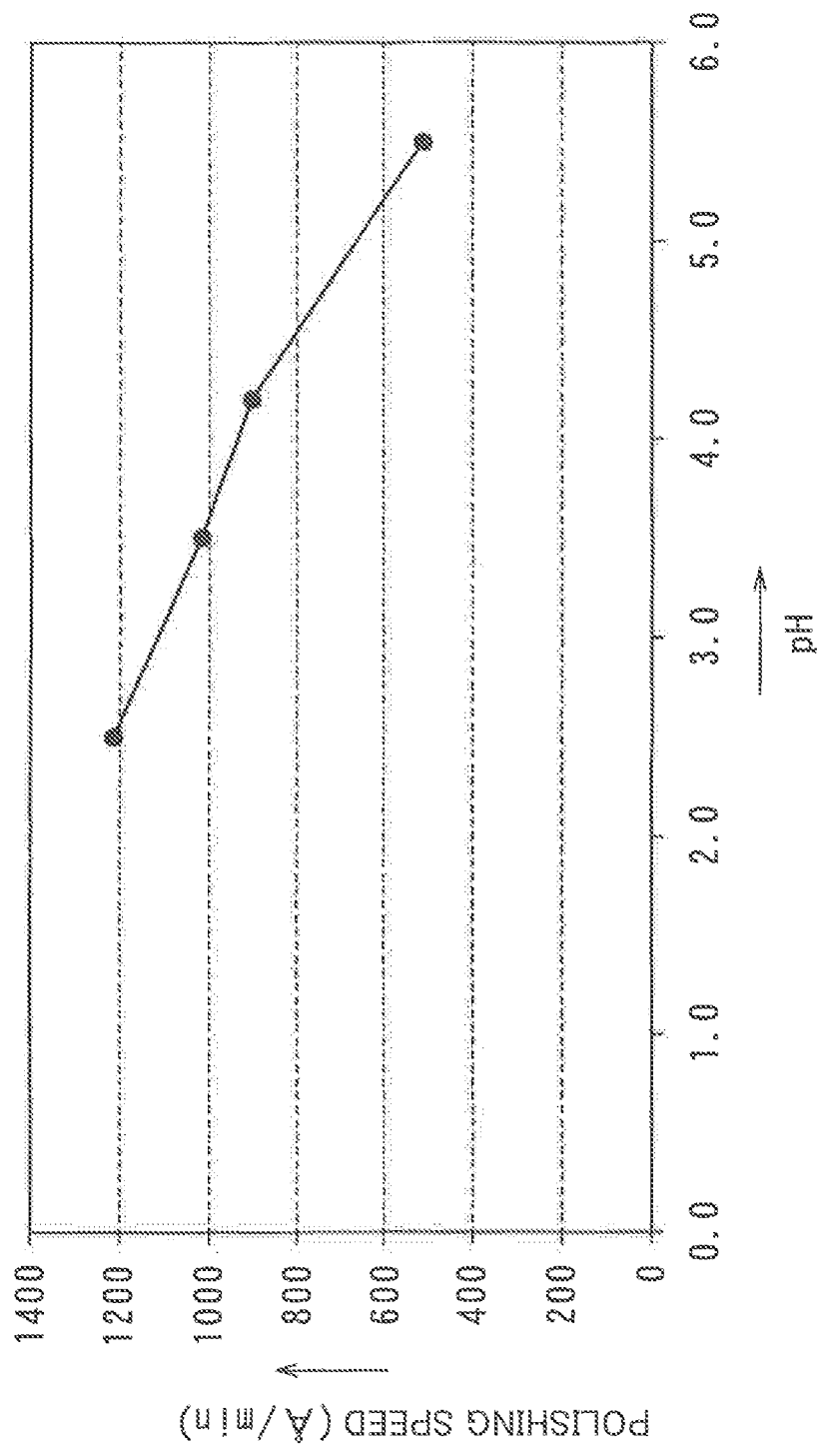
FIG. 12 is a graph showing the effect of pH on a polishing speed R3 for a TEOS layer.

FIG. 12 is a graph showing the effect of the pH on the polishing speed R8 for the TEOS layer, and FIG. 13 is a graph showing the effect of pH on the polishing speed E1 for the silicon nitride layer. The abscissa represents the pH of the polishing composition and the ordinate represents the polishing speed (Å/mm).

The polishing speed R3 for the TEOS layer was 1215 Å/min in Inventive Example 20, 1024 (Å/min) in Inventive Example 21, 902 Å/min in Inventive Example 22, and 511 Å/min in Inventive Example 23. As can be understood from the graph in FIG. 12, the polishing speed R3 decreased as the pH increased.

As can be understood from FIG. 13, the polishing speed R1 for the silicon nitride layer was substantially constant when the pH of the oxidizing agent was changed.

In this way, since the polishing speed R1 for the silicon nitride layer is substantially constant when the pH is changed, the second selectivity R3/R1 can be controlled based on the polishing speed R3 for the TEOS layer. When the pH was changed from 2.5 to 5.5, the second selectivity R3/R1 changed from 0.63 to 1.41.

It has been found that the second selectivity R3/R1 can be controlled readily to a desired value in the range from 0.63 to 1.41 by changing only the pH.

As in the foregoing, in the composition for polishing silicon nitride according to the present invention, the first selectivity R2/R1 can be controlled readily to a value less than or not less than 1 only by changing the amount of the oxidizing agent to be added. The second selectivity R3/R1 can be controlled readily to a value less than or not less than 1 simply by changing the pH.

The present invention can be carried out in other various modes without departing from its spirit or essential features. Therefore, the above-described embodiment is simply illustrative in every aspect and the scope of the present invention, therefore, is to be determined by the following claims and is by no means limited by the above description. Modifications and variations belonging to the scope of claims are all within the scope of the present invention.

What is claimed is:

1. A method of controlling a selectivity using a composition for polishing silicon nitride, comprising:
preparing a polishing composition including colloidal silica, a polishing aid composed of a phosphoric acid compound and a sulfuric acid compound, and an oxidizing agent, wherein the content of the oxidizing agent is more than 0.0 wt % and at most 0.17 wt %, and a pH of the polishing composition is in a range from 1.5 to 5.5, polishing a silicon nitride layer, a metal layer, and a oxide insulating layer using the polishing composition, evaluating a polishing speed for the silicon nitride layer, a polishing speed for the metal layer, and a polishing speed for the oxide insulating layer, calculating a first selectivity representing a ratio of the polishing speed for the metal layer to the polishing speed for the silicon nitride layer, and a second selectivity representing a ratio of the polishing speed for the oxide insulating layer to the polishing speed for the silicon nitride layer, determining a content of an oxidizing agent of a composition for polishing silicon nitride to be produced depending on the first selectivity, wherein the determined content of the oxidizing agent is more than 0.0 wt % and at most 0.17 wt %, and a pH of the composition for polishing silicon nitride to be produced depending on the second selectivity, wherein the determined pH is in the range from 1.5 to 5.5, and producing a composition for polishing silicon nitride having the determined content of an oxidizing agent and the determined pH.

2. The method for controlling a selectivity using a composition for polishing silicon nitride according to claim 1, wherein the first selectivity of the composition for polishing silicon nitride to be produced is in the range from 0.29 to 1.77, and the second selectivity of the composition for polishing silicon nitride to be produced is in the range from 0.63 to 1.41.

* * * * *